United States Patent
Zhang (10) Patent No.: US 11,189,797 B2
(45) Date of Patent: Nov. 30, 2021

(54) DISPLAY PANEL, PLASMA ETCHING METHOD AND SYSTEM

(71) Applicant: WUHAN CHINA STAR OPTOELECTRONICS SEMICONDUCTOR DISPLAY TECHNOLOGY CO., LTD., Wuhan (CN)

(72) Inventor: Pengbin Zhang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 299 days.

(21) Appl. No.: 16/464,195

(22) PCT Filed: Apr. 30, 2019

(86) PCT No.: PCT/CN2019/085112
§ 371 (c)(1),
(2) Date: May 24, 2019

(87) PCT Pub. No.: WO2020/077980
PCT Pub. Date: Apr. 23, 2020

(65) Prior Publication Data
US 2021/0119128 A1    Apr. 22, 2021

(30) Foreign Application Priority Data
Oct. 16, 2018  (CN) .......................... 201811203968.9

(51) Int. Cl.
*H01L 29/08*    (2006.01)
*H01L 51/00*    (2006.01)
(Continued)

(52) U.S. Cl.
CPC .......... *H01L 51/0018* (2013.01); *H01L 51/56* (2013.01); *H01J 37/32889* (2013.01); *H01J 2237/3341* (2013.01)

(58) Field of Classification Search
CPC ......... H01L 21/32136; H01L 21/76886; H01L 21/76888; H01L 29/49; H01L 29/4908; H01L 51/0018; H01L 51/56
(Continued)

(56) References Cited

U.S. PATENT DOCUMENTS 5,700,740 A * 12/1997 Chen ................. H01L 21/02071
216/67
5,741,742 A * 4/1998 Kamide ............ H01L 21/32136
438/653
(Continued)

FOREIGN PATENT DOCUMENTS

CN        107731681 A      2/2018

*Primary Examiner* — Brook Kebede
(74) *Attorney, Agent, or Firm* — Osha Bergman Watanabe & Burton LLP (57) ABSTRACT

Provided are a display panel, a plasma etching method and a system. After patterning a metal film layer on a substrate with a chlorine-containing gas, a post-treatment for suppressing corrosion is implemented by using plasma containing an oxygen-containing gas and a hydrogen-fluoride-containing gas. Thus, the surface of the metal film layer is an aluminum ion-containing crystal, which solves the technical problem of corrosion of the aluminum layer in the plasma etching technology of the prior art.

14 Claims, 6 Drawing Sheets

(51) Int. Cl.
*H01L 51/56* (2006.01)
*H01J 37/32* (2006.01)

(58) Field of Classification Search
USPC .......................................................... 257/40
See application file for complete search history.

(56) References Cited

U.S. PATENT DOCUMENTS 6,017,826 A * 1/2000 Zhou ................. H01L 21/32136
216/67
2004/0263746 A1* 12/2004 Cho .................... H01L 27/1248
349/139

* cited by examiner

DISPLAY PANEL, PLASMA ETCHING METHOD AND SYSTEM

FIELD OF THE INVENTION

The present application relates to an etching field, and more particularly to a display panel, a plasma etching method and a system.

BACKGROUND OF THE INVENTION

A thin film transistor (TFT: Thin Film Transistor) used for a low temperature polysilicon (LTPS) or active matrix organic light emitting diode (AMOLED) array substrate is formed on a substrate such as a glass substrate by patterning and laminating a gate, a gate insulating film, a semiconductor layer one after another, sequentially.

For instance, as a TFT of a bottom-gate side structure of a channel etching is formed, a gate, a gate insulating film, and an oxide semiconductor film are sequentially formed on a glass substrate, and then a metal film is formed on the oxide semiconductor film, and then the metal film is formed thereon. Then, the film layer is plasma etched to form a source and a drain. As the metal film to be the source and the drain, a Ti/Al/Ti film layer is generally used, and a chlorine-containing gas, such as chlorine is used as an etching gas. After the Ti/Al/Ti film layer is dry etched by using chlorine ($Cl_2$) gas, Cl and Al adhere to the surface of the Ti/Al/Ti film layer in a form of $AlCl_X$ (mainly $AlCl_3$).

After the substrate is removed out of the etching system, $AlCl_X$ on the surface of the Ti/Al/Ti film layer will come into contact with air, which will chemically react with moisture and oxygen in the air to corrode the Al layer.

Namely, the existing plasma etching of the prior art has a technical problem of corrosion of the Al layer.

SUMMARY OF THE INVENTION

The present application provides a display panel, a plasma etching method and a system to solve a technical problem of corrosion of a aluminum layer existing in the plasma etching of prior art.

To solve the aforesaid problem, the technical solution of the present application is described as follows:

The embodiment of the present application provides a display panel, including:

a substrate;

a metal film layer formed on the substrate; wherein the metal film layer includes at least one aluminum layer;

wherein an etched surface of the at least one aluminum layer formed by plasma etching is covered with an aluminum ion-containing crystal.

In the display panel provided by the present application, the etched surface of the at least one aluminum layer is a flat plane.

In the display panel provided by the present application, the aluminum ion-containing crystal is aluminum fluoride.

In the display panel provided by the present application, the metal film layer is a titanium aluminum titanium layer.

In the display panel provided by the present application, the titanium aluminum titanium layer is patterned to form a source line and a drain line.

In the display panel provided by the present application, the titanium aluminum titanium layer is patterned to form a signal line.

In the display panel provided by the present application, the display panel includes:

a buffer layer formed on the substrate;

an active layer formed on the buffer layer, wherein the active layer includes an ion-doped doping region;

a first insulating layer formed on the active layer;

a gate layer formed on the first insulating layer;

a second insulating layer formed on the gate layer;

a third insulating layer formed on the second insulating layer;

a source drain layer formed on the third insulating layer and connected to the doping region through a via hole;

a planarization layer formed on the source drain layer;

an anode layer formed on the planarization layer;

an organic light emitting layer formed on the anode layer;

a cathode layer formed on the organic light emitting layer; and a thin film encapsulation layer formed on the cathode layer;

wherein the metal film layer includes the source drain layer.

In the display panel provided by the present application, the substrate includes one of a glass substrate, a quartz substrate and a resin substrate.

In the display panel provided by the present application, the first insulating layer covers the active layer.

In the display panel provided by the present application, a material of the gate layer includes at least one of molybdenum, aluminum, aluminum-nickel alloy, molybdenum-tungsten alloy, chromium and copper.

In the display panel provided by the present application, the anode layer is a non-transparent light blocking layer.

In the display panel provided by the present application, the organic light emitting layer includes a first common layer, a light emitting layer and a second common layer.

In the display panel provided by the present application, the cathode layer is made of a transparent material.

In the display panel provided by the present application, the thin film encapsulation layer includes an organic layer and two inorganic layers, which are alternately arranged.

The embodiment of the present application provides a plasma etching method, including:

delivering a substrate into a processing container of a first plasma etching apparatus, and performing a first plasma etching on a metal film layer on the substrate by using a chlorine-containing gas to implement a patterning process step of forming a conductive line; wherein the metal film layer includes at least one aluminum layer; and delivering the substrate after the first plasma etching into a processing container of a second plasma etching apparatus, and implementing a post-treatment step for suppressing corrosion by using plasma containing an oxygen-containing gas and a hydrogen-fluoride-containing gas.

In the display panel provided by the present application, the chlorine-containing gas is chlorine.

In the display panel provided by the present application, the oxygen-containing gas is oxygen.

In the display panel provided by the present application, the hydrogen-fluoride-containing gas is $C_xH_yF_z$, wherein $x \geq 1$, $y \geq 1$, $z \geq 1$, and x, y and z are integers.

In the display panel provided by the present application, the $C_xH_yF_z$ is one of $CHF_3$ and $C_2HF_5$.

The embodiment of the present application provides a plasma etching system, including:

a first plasma etching apparatus, including a processing container to receive a substrate for performing a first plasma etching on a metal film layer on the substrate in the processing container by using a chlorine-containing gas to implement a patterning process of forming a conductive line; wherein the metal film layer includes at least one aluminum layer;

a second plasma etching apparatus, including a processing container to receive the substrate for implementing a post-treatment for suppressing corrosion by using plasma containing an oxygen-containing gas and a hydrogen-fluoride-containing gas; and a vacuum transferring chamber, connected to the first plasma etching apparatus and the second plasma etching apparatus for transferring the substrate between the first plasma etching apparatus and the second plasma etching apparatus by a transferring mechanism provided in the vacuum transferring chamber while maintaining a vacuum state.

The benefits of the present application are: the present application provides a new display panel, a new plasma etching method and a new system. After patterning the metal film layer on the substrate with the chlorine-containing gas to implement the patterning process of forming the conductive line, the substrate after the first plasma etching is delivered into the processing container of the second plasma etching apparatus under vacuum condition and then, the post-treatment for suppressing corrosion is implemented by using plasma containing the oxygen-containing gas and the hydrogen-fluoride-containing gas; thus, $AlCl_X$ on the surface of the metal film layer is replaced with $AlF_X$, and because $AlF_X$ is ionic crystal that does not chemically react with moisture and oxygen in the air, and thus does not corrode the Al (aluminum) layer, which solves the technical problem of corrosion of the Al layer in the plasma etching technology of the prior art.

BRIEF DESCRIPTION OF THE DRAWINGS

In order to more clearly illustrate the embodiments of the present invention and the prior art, the following figures will be described in the embodiments and the prior art are briefly introduced. It is obvious that the drawings are only some embodiments of the present invention, those of ordinary skill in this field can obtain other figures according to these figures without paying the premise.

REFERENCE NUMERALS

1: glass substrate
2: gate
3: gate insulating film
4: semiconductor film
5: Ti/Al/Ti laminated film
5a: upper Ti film
5b: Al film
5c: lower Ti film
6: photoresist film
10: vacuum transferring chamber
20: vacuum delivering chamber
30: first plasma etching apparatus
40: second plasma etching apparatus
50: carrier
60: transferring mechanism
70: vacuum transferring mechanism
80: controller
100: plasma etching system
101: processing container
102: dielectric wall
104: chamber
111: spray housing
113: high frequency antenna
115: high frequency power supply
120, 220: processing gas supply mechanism
130: substrate mounting table
132: electrostatic chuck
133: shield ring
160: exhaust mechanism
S: substrate

DETAILED DESCRIPTION OF PREFERRED EMBODIMENTS

The following descriptions for the respective embodiments are specific embodiments capable of being implemented for illustrations of the present application with referring to appended figures. The terms of up, down, front, rear, left, right, interior, exterior, side, etcetera mentioned in the present application are merely directions of referring to appended figures. Thus, the used directional terms are used to describe and understand the present application, but the present invention is not limited thereto. In the figure, units with similar structures are denoted by the same reference numerals.

Figure 9:
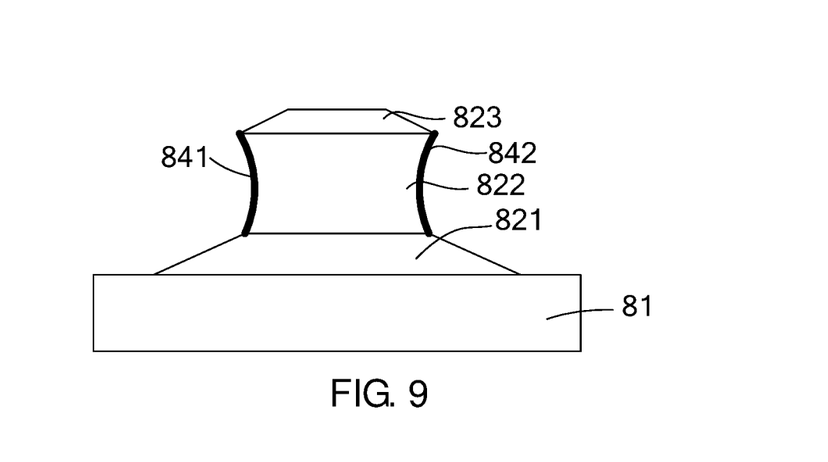
FIG. 9 is a cross-sectional structural diagram of a conductive line of the prior art.

As regarding the technical problem of corrosion of the Al layer in the plasma etching technology of the prior art shown in FIG. 9, in the present application, after patterning the metal film layer on the substrate with the chlorine-containing gas to implement the patterning process of forming the conductive line, the substrate after the first plasma etching is delivered into the processing container of the second plasma etching apparatus under vacuum condition and then, the post-treatment for suppressing corrosion is implemented by using plasma containing the oxygen-containing gas and the hydrogen-fluoride-containing gas; thus, $AlCl_X$ on the surface of the metal film layer is replaced with $AlF_X$, and because $AlF_X$ is ionic crystal that does not chemically react with moisture and oxygen in the air, and thus does not corrode the Al (aluminum) layer to solve the defect.

The metal film layer referred in the present application includes at least one aluminum layer, such as Ti/Al/Ti, Ti/Al, Al/Ti, etc., and Ti/Al/Ti is illustrated below.

The oxygen-containing gas according to the present application may be oxygen, water vapor or the like, and oxygen gas is illustrated below.

The hydrogen-fluoride-containing gas referred in the present application may be $C_XH_YF_Z$, such as $CHF_3$, $C_2HF_5$ or the like, or may be $S_YH_YF_Z$ or $N_YH_YF_Z$, wherein $x \geq 1$, $y \geq 1$, $z \geq 1$, and x, y and z are integers.

First, the plasma etching system provided by the present application will be described.

Figure 1:
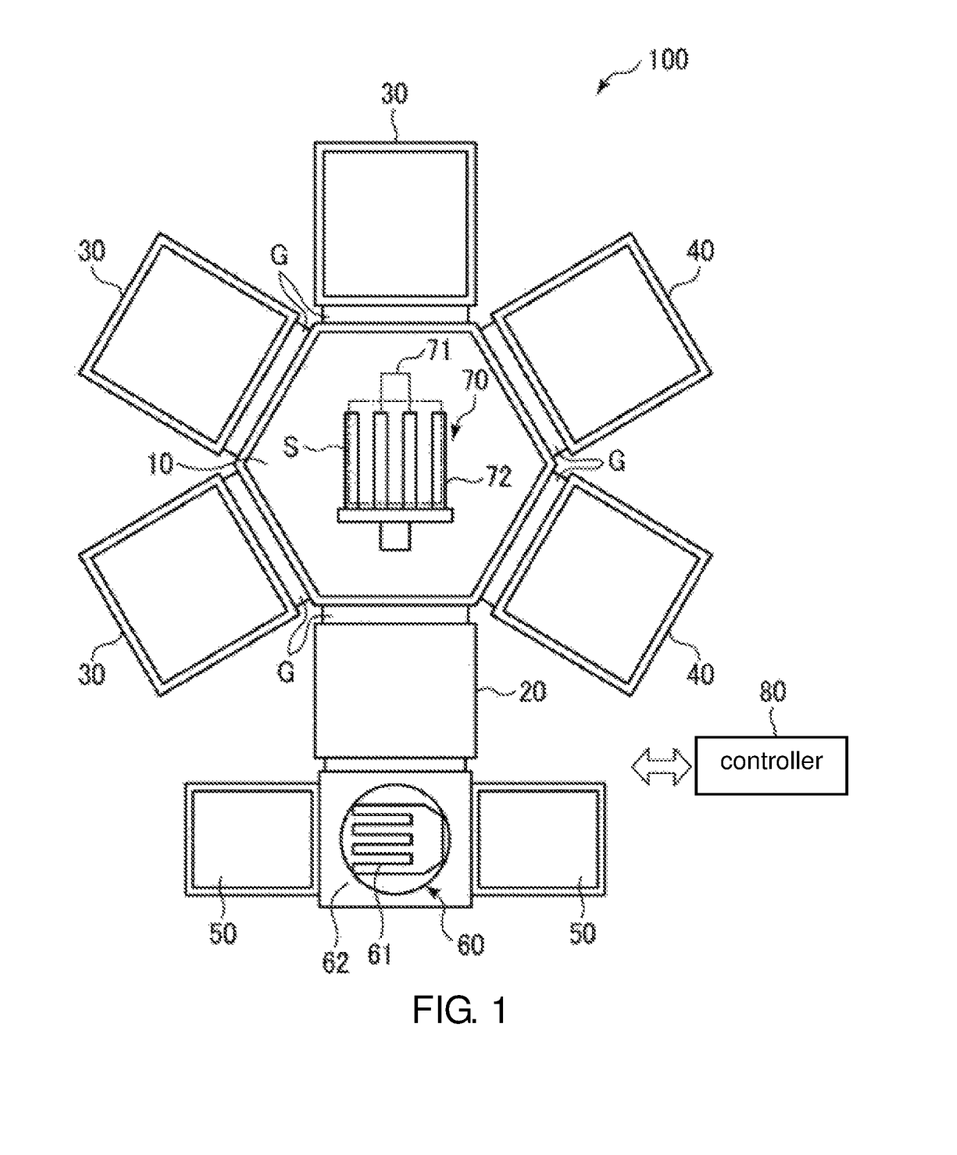
FIG. 1 is a diagram of a plasma etching system provided by the present application.

FIG. 1 is a diagram of a plasma etching system provided by the present application. As shown in FIG. 1, the plasma etching system 100 is a multi-chamber type and includes: a vacuum transferring chamber 10, a vacuum delivering chamber 20, three first plasma etching apparatuses 30 and two second plasma etching apparatuses 40, wherein the first plasma etching apparatus 30 and the second plasma etching apparatus 40 perform processes under a predetermined reduced pressure atmosphere. The vacuum transferring chamber 10 possesses a hexagonal planar shape. The vacuum delivering chamber 20, the three first plasma etching apparatuses 30 and the two second plasma etching apparatuses 40 are connected to the respective wall portions of the vacuum transferring chamber 10 through the gate valves G. A carrier 50 that accommodates a rectangular substrate S is disposed outside the vacuum delivering chamber 20.

A transferring mechanism 60 is disposed between the two carriers 50. The transferring mechanism 60 possesses top and bottom forks 61 (only one shown) and a susceptor 62 supporting the forks to integrally moving the forks forward and backward and rotating the forks.

The vacuum transferring chamber 10 can be held in a predetermined reduced pressure atmosphere with the vacuum transferring mechanism 70 configured therein. The vacuum transferring mechanism 70 transfers the substrate S among the vacuum delivering chamber 20, the three first plasma etching apparatuses 30 and the two second plasma etching apparatuses 40. The vacuum transferring mechanism 70 is provided with two substrate transferring arms 72 (only one shown) that can be moved back and forth in the susceptor 71, which is rotatable and movable up and down.

The vacuum delivering chamber 20 is configured for transferring the substrate S between the carrier 50 located in the air atmosphere and the vacuum transferring chamber 10 located in a reduced pressure atmosphere, and is capable of switching between the vacuum atmosphere and the air atmosphere in a short time. The vacuum delivering chamber 20 is provided with two upper and lower substrate housing portions, and the substrate S is positioned by a positioner (not shown) in each of the substrate housing portions.

The plasma etching system 100 further includes a controller 80. The controller 80 is composed of a computing mechanism, which includes a central processing unit and a storage unit. Each component of the plasma etching system 100 (vacuum transferring chamber 10, vacuum delivering chamber 20, first plasma etching apparatus 30, second plasma etching apparatus 40, transferring mechanism 60 and vacuum transferring mechanism 70) is controlled based on the processing scheme (program) stored in the storage unit to perform the predetermined processes. The processing scheme is stored in a storage medium, such as a hard disk, an optical disk or a semiconductor memory.

Figure 2:
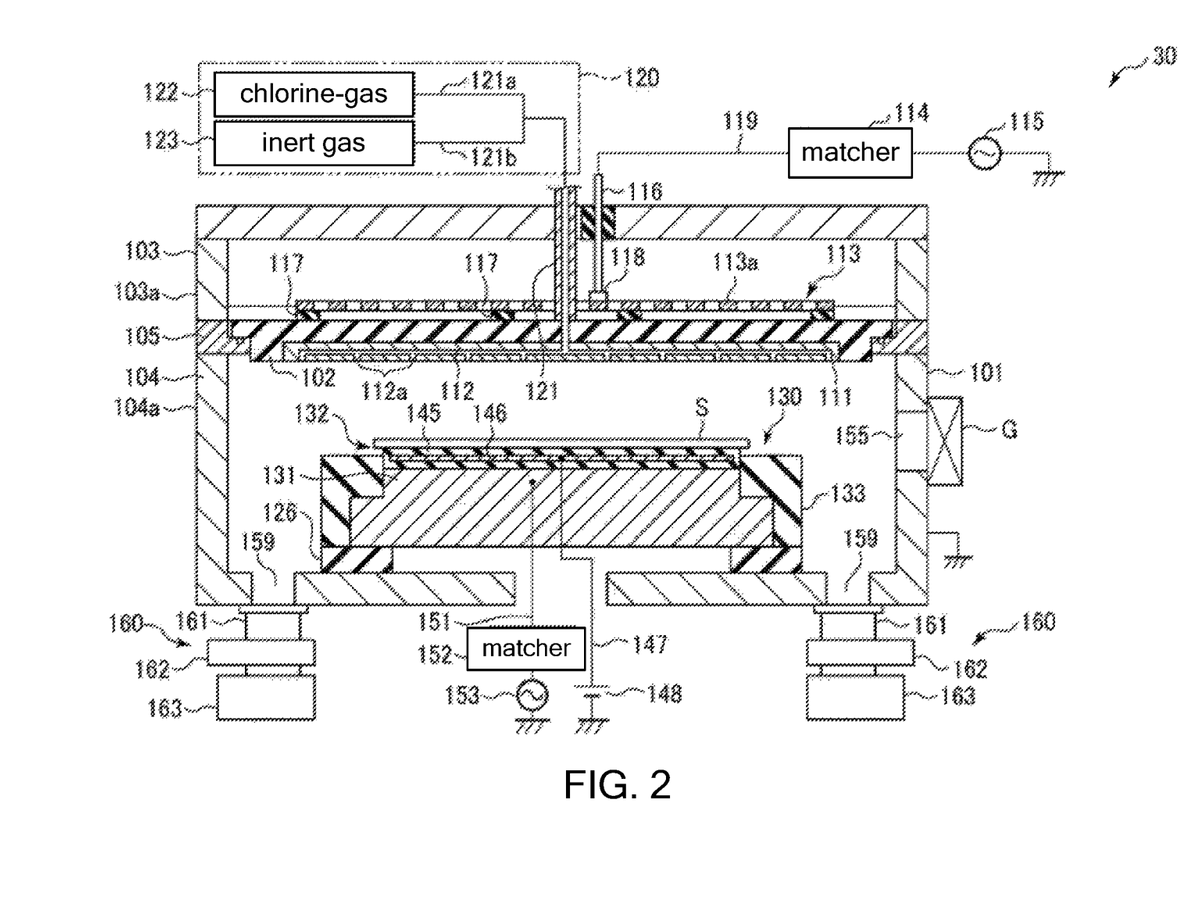
FIG. 2 is a diagram of a first plasma etching apparatus provided by the present application.

FIG. 2 is a diagram of a first plasma etching apparatus 30. The first plasma etching apparatus 30 is configured for etching the Al film of the Ti/Al/Ti laminated film of the substrate S. For instance, a prismatic airtight main body container 101 made of aluminum, of which the inner wall surface is anodized, is included. The main body container 101 is detachably assembled. An antenna container 103 that draws an antenna chamber is formed on the upper side, and a chamber (processing container) 104 that draws a processing chamber is formed on the lower side. The dielectric wall 102 constitutes the top wall of the chamber 104 and is made of ceramic, such as $Al_2O_3$ or quartz.

A support frame 105 projecting inward is provided between the side wall 103a of the antenna container 103 and the side wall 104a of the chamber 104 of the main body container 101, and the dielectric wall 102 is positioned on the support frame 105.

A spray housing 111 for supplying a processing gas is embedded in a lower portion of the dielectric wall 102. The spray housing 111 is in a state of being suspended from the top of the main body container 101 by a plurality of suspension members (not shown).

The spray housing 111 is made of a conductive material, such as aluminum, of which an inner or an outer surface is anodized. A horizontally extending gas flow path 112 is formed in the spray housing 111, and the gas flow path 112 communicates with a plurality of gas discharge holes 112a, which extend downward.

Meanwhile, a gas supply pipe 121 is provided in the center of the upper surface of the dielectric wall 102 so as to communicate with the gas flow path 112. The gas supply pipe 121 penetrates from the top of the main body container 101 to the outside thereof, and branches into branch pipes 121a and 121b. The branch pipe 121a is connected to a chlorine-containing gas supply source 122 that supplies a chlorine-containing gas, such as chlorine ($Cl_2$). Besides, the branch pipe 121b is connected to an inert gas supply source 123 that supplies an inert gas, such as Ar or $N_2$ used as a purge gas or a diluent gas. The chlorine-containing gas is used as an etching gas or a dry cleaning gas. The branch pipes 121a and 121b are provided with a flow controller or a valve system, such as a mass flow controller.

The gas supply pipe 121, the branch pipes 121a and 121b, the chlorine-containing gas supply source 122, the inert gas supply source 123, the flow controller and the valve system constitute the processing gas supply mechanism 120.

In the plasma etching apparatus 30, the chlorine-containing gas supplied from the processing gas supply mechanism 120 is supplied into the spray housing 111, and then is discharged into the chamber 104 from the gas discharge holes 112a at the lower side thereof to etch Ti/Al/Ti laminated film of the substrate S. The chlorine-containing gas is preferably chlorine ($Cl_2$) gas. However, boron trichloride ($BCl_3$) gas, carbon tetrachloride ($CCl_4$) gas or the like may also be utilized.

A high frequency (RF) antenna 113 is provided in the antenna container 103. The high frequency antenna 113 is configured by arranging an antenna wire 113a made of a good conduced metal, such as copper or aluminum in an arbitrary shape used in the prior art. A ring shape or a spiral shape may be illustrated. A multiple antenna utilizing a plurality of antenna sections may also be considered. The high frequency antenna 113 is separated from the dielectric wall 102 by a spacer 117 made of an insulating member.

The terminal 118 of the antenna 113a is connected to a power supply member 116 that extends above the antenna container 103. The upper end of the power supply member 116 is connected to a power supply line 119, and the power supply line 119 is connected to a matcher 114 and a high frequency power supply 115. Besides, an induced electric field is formed in the chamber 104 by supplying high frequency power having a frequency of, such as, 13.56 MHz from the high frequency power supply 115 to the high frequency antenna 113. The processing gas supplied from the spray housing 111 is plasma-generated by the induced electric field to generate an inductively coupled plasma.

A substrate mounting table 130, on which the substrate S is placed, is provided on the bottom wall in the chamber 104 via a spacer 126 formed of a frame-shaped insulator. The substrate mounting table 130 includes a base material 131 disposed on the aforesaid spacer 126, an electrostatic chuck 132 disposed on the base material 131 and a sidewall insulating member 133 covering the sidewall of the base material 131 and the sidewall of the electrostatic chuck 132. The base material 131 and the electrostatic chuck 132 possess a rectangular shape corresponding to the shape of the substrate S, and the substrate mounting table 130 is formed in a quadrangular plate shape or a column shape as a whole. The spacer 126 and the sidewall insulating member 133 are made of an insulating ceramic, such as alumina.

The electrostatic chuck 132 includes a dielectric layer 145 made of a ceramic spray film formed on the surface of the base material 131 and an adsorption electrode 146 provided inside the dielectric layer 145. The adsorption electrode 146 can be in various forms, such as a plate shape, a film shape, a lattice shape or a mesh shape. The adsorption electrode 146 is connected to the direct current power supply 148 via the power supply line 147, and a direct current voltage is applied to the adsorption electrode 146. The power supply of the adsorption electrode 146 is turned on and off by a switch (not shown). The substrate S is adsorbed by applying a direct current voltage to the adsorption electrode 146 to generate an electrostatic adsorption force, such as Coulomb force or Johnson-Rahbek force. The dielectric layer 145 of the electrostatic chuck 132 is made of alumina ($Al_2O_3$), yttrium oxide ($Y_2O_3$) or the like.

The base material 131 is connected to the high frequency power supply 153 for bias apply via the power supply line 151. Furthermore, a matcher 152 is provided between the base material 131 of the power supply line 151 and the high frequency power supply 153. The high frequency power supply 153 is for introducing ions into the substrate S on the base material 131 by using a frequency in the range of 50 kHz to 10 MHz, such as, 3.2 MHz.

Furthermore, a temperature adjustment mechanism and a temperature sensor (none of which are shown) for controlling the temperature of the substrate S are provided in the base material 131 of the substrate mounting table 130. Besides, a heat conducting gas supply mechanism (not shown) for supplying a heat conducting gas, such as He for conducting heat between the substrate S and the substrate mounting table 130 in a state, where the substrate S is placed on the substrate mounting table 130, is provided. Moreover, a plurality of lift pins (not shown) capable of projecting and immersing for handover of the substrate S are provided on the upper surface of the electrostatic chuck 132. The handover of the substrate S is performed on the lift pins in a state of protruding upward from the upper surface of the electrostatic chuck 132.

The side wall 104a of the chamber is provided with a carry-in/out port 155 for carrying the substrate S in and out of the chamber 104, and the carry-in/out port 155 can be opened and closed by the gate valve G. By opening the gate valve G, the vacuum transferring mechanism 70 configured in the vacuum transferring chamber 10 can carry in and out the substrate S via the carry-in/out port 155.

A plurality of exhaust ports 159 (only two are shown) are formed at the edge or corner portion of the bottom wall of the chamber 104, and an exhaust portion 160 is provided at each of the exhaust ports 159. The exhaust portion 160 includes an exhaust pipe 161 connected to the exhaust port 159, an automatic pressure control valve (APC) 162 that controls the pressure in the chamber 104 by adjusting the opening degree of the exhaust pipe 161 and a vacuum pump 163 that exhausts the inside of the chamber 104 via the exhaust pipe 161. Then, the vacuum pump 163 exhausts the inside of the chamber 104. In the plasma etching process, the chamber 104 is set and maintained in a predetermined vacuum atmosphere by adjusting the opening degree of the automatic pressure control valve (APC) 162.

Figure 3:
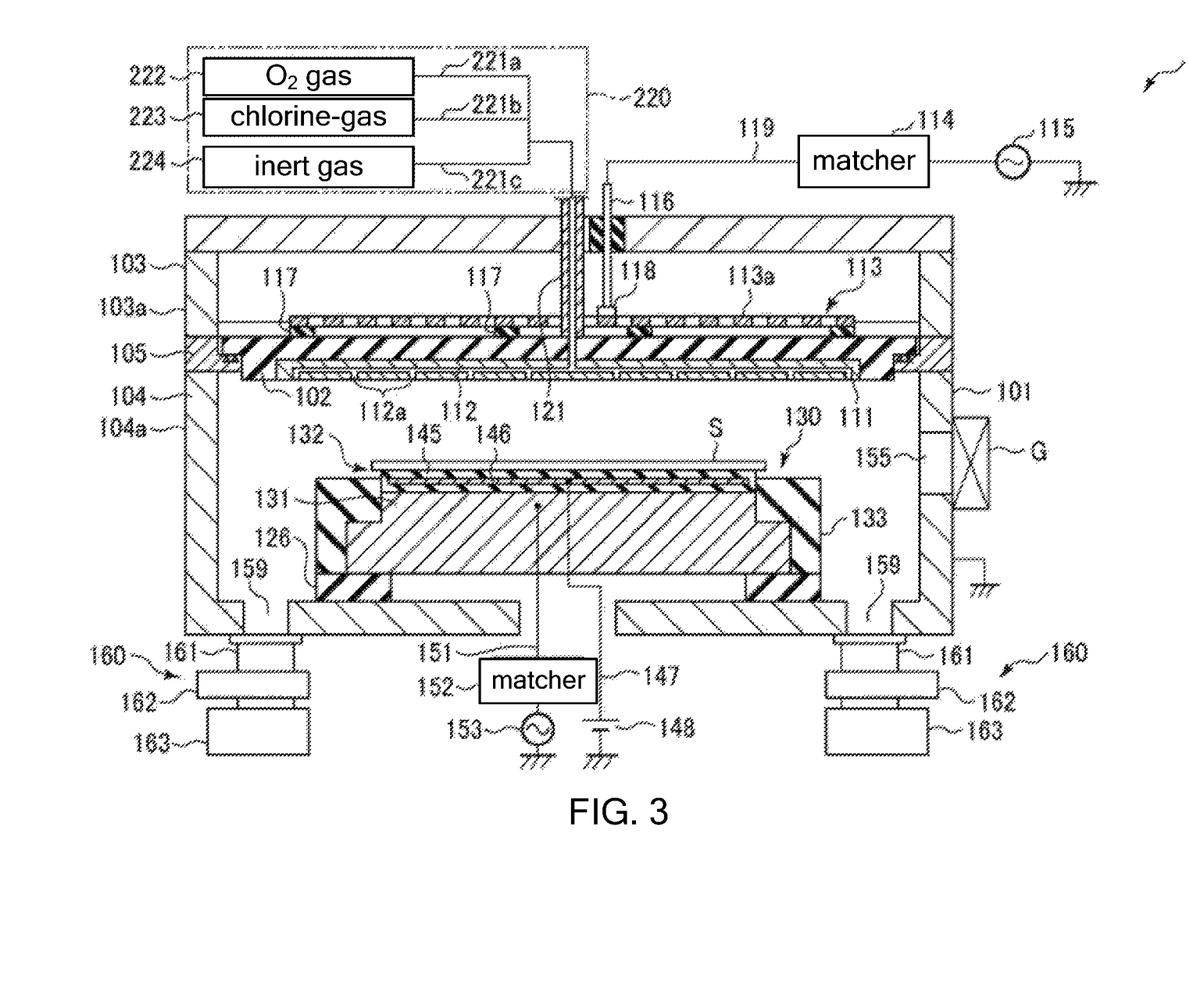
FIG. 3 is a diagram of a second plasma etching apparatus provided by the present application.

FIG. 3 is a diagram of a second plasma etching apparatus 40. The second plasma etching apparatus 40 is configured for performing etching of a lower Ti film of a Ti/Al/Ti laminated film of the substrate S and a post-treatment for suppressing corrosion. The second plasma etching apparatus 40 is provided with a processing gas supply mechanism 220 instead of the processing gas supply mechanism 120. Except for this, it is identical in structure to the first plasma etching apparatus 30 of FIG. 2. Therefore, the same portions as those in FIG. 2 are denoted by the same reference numerals, and the description thereof will be omitted.

The processing gas supply mechanism 220 includes a gas supply pipe 221, branch pipes 221a, 221b and 221c branched from the gas supply pipe 221 outside and above the main body container 101, an $O_2$ gas supply source 222 connected to the branch pipe 221a for supplying $O_2$, a hydrogen-fluoride-containing gas supply source 223 connected to the branch pipe 221b for supplying a hydrogen-fluoride-containing gas, such as $CHF_3$ or $C_2HF_5$, and an inert gas supply source 224 connected to the branch pipe 221c for supplying an inert gas, such as Ar or $N_2$ as a purge gas and a diluent gas. The gas supply pipe 221 is connected to the gas flow path 112 of the spray housing 111 as the same as the gas supply pipe 121 of the first plasma etching apparatus 30 of FIG. 2.

In the second plasma etching apparatus 40, the chlorine-containing gas supplied from the processing gas supply mechanism 220 is supplied into the spray housing 111, and then is discharged into the chamber 104 from the gas discharge holes 112a at the lower side thereof to etch the lower Ti film of the Ti/Al/Ti laminated film of the substrate S. Moreover, after etching, the $O_2$ gas or the $O_2$ and chlorine-containing gas supplied from the processing gas supply mechanism 220 is supplied into the chamber 104 for implementing a post-treatment step for suppressing corrosion. The chlorine-containing gas is preferably $CHF_3$ or $C_2HF_5$ gas. However, $SHF_6$, $NHF_3$ or the like may also be utilized.

Based on the foregoing description, the plasma etching method provided by the present application will be described with reference to FIG. 4 and FIG. 5.

Figure 4:
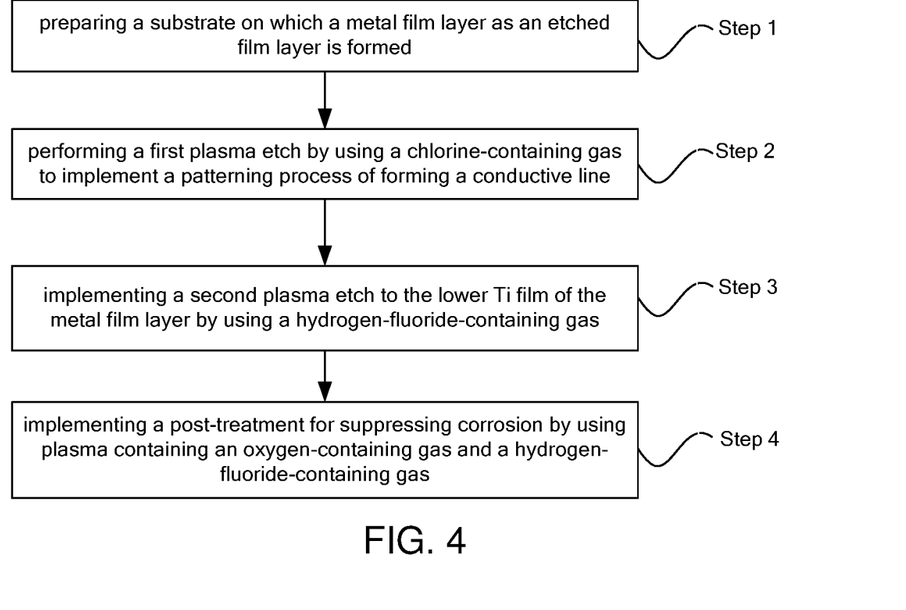
FIG. 4 is a flow chart of a plasma etching method provided by the present application.

As shown in FIG. 4, a plasma etching method provided by the present application includes steps of:

Step 1, preparing a substrate on which a metal film layer as an etched film layer is formed.

Figure 5:
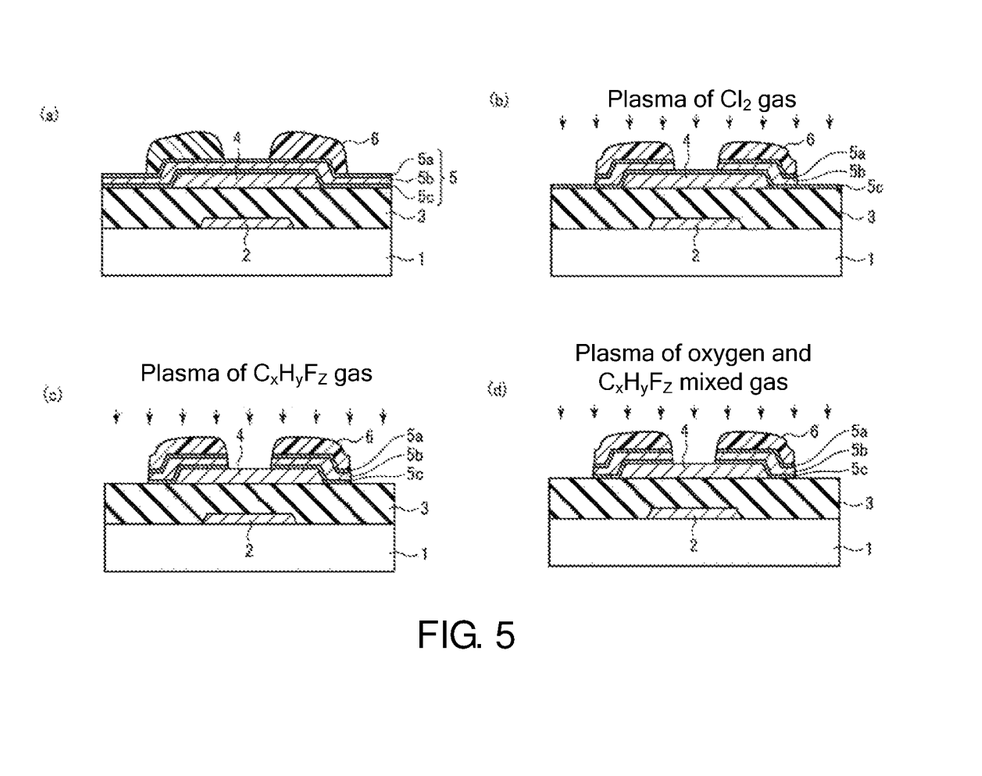
FIG. 5 is a diagram of an interface of a metal film layer provided by the present application.

As shown in FIG. 5(a), a substrate S possessing a Ti/Al/Ti laminated film as an etched film layer is prepared.

The substrate S is used for forming a channel etching type bottom gate structure thin film transistor. Specifically, a gate 2 is formed on a glass substrate 1. A semiconductor film 4 made of an oxide semiconductor, such as IGZO is formed above the gate with a gate insulating film 3 inbetween. Then, the Ti/Al/Ti laminated film 5 as a source and a drain is formed thereon.

The Ti/Al/Ti laminated film includes an upper Ti film 5a, a lower Ti film 5c and an Al film 5b interposed therebetween. The Al film 5b may be made of either only Al element or an Al—Si alloy. The film thickness of the upper Ti film 5a and the lower Ti film 5c is about 30 nm to 100 nm, and the film thickness of the Al film 5b is about 300 nm to 1000 nm. A photoresist film 6 as an etching mask is formed on the Ti/Al/Ti laminated film 5. The substrate S is accommodated on the carrier 50.

Step 2, delivering a substrate into a processing container of a first plasma etching apparatus, and performing a first plasma etching on a metal film layer on the substrate by using a chlorine-containing gas to implement a patterning process step of forming a conductive line.

As shown in FIG. 5(b), the substrate S is taken out from the carrier 50 by the transferring mechanism 60, and transferred to the vacuum delivering chamber 20. The vacuum transferring mechanism 70 in the vacuum transferring chamber 10 receives the substrate S from the vacuum delivering chamber 20 and transfers the same to the first plasma etching apparatus 30. In the first plasma etching apparatus 30, the plasma etching process is implemented to the upper Ti film 5a and the Al film 5b of the Ti/Al/Ti laminated film 5 by using a chlorine-containing gas, such as $Cl_2$.

In the first plasma etching apparatus 30, first, the inside of the chamber 104 is adjusted by the exhaust mechanism 160 to a pressure matching the vacuum transferring chamber 10. The gate valve G is opened, and the vacuum transferring mechanism 70 carries the substrate S into the chamber 104 via the carry-in/out port 155 and places the substrate S on the substrate mounting table 130. After the vacuum transferring mechanism 70 is withdrawn from the chamber 104, the gate valve G is closed.

In this state, the pressure in the chamber 104 is adjusted to a predetermined degree of vacuum by the automatic pressure control valve (APC) 162, and the chlorine-containing gas, such as $Cl_2$ as an etching gas is supplied from the processing gas supply mechanism 120 to the chamber through the spray housing 111 as a processing gas. In addition to the chlorine-containing gas, an inert gas such as Ar may be supplied as the diluent gas.

At this time, the substrate S is adsorbed by the electrostatic chuck 132, and temperature adjustment is performed by a temperature adjustment mechanism (not shown).

Then, a uniform induced electric field is formed in the chamber 104 via the dielectric wall 102 by supplying high frequency power having a frequency of, such as, 13.56 MHz from the high frequency power supply 115 to the high frequency antenna 113. Using such induced electric field, a plasma of a chlorine-containing gas is generated. Thus, the generated high density inductively coupled plasma etches the upper Ti film 5a and the Al film 5b in the Ti/Al/Ti laminated film 5 of the substrate S.

Then, when the etching end point is detected by a predetermined method, the etching is ended.

Step 3, delivering the substrate after the first plasma etching into a processing container of the second plasma etching apparatus, and implementing a second plasma etching to the lower Ti film of the metal film layer by using a hydrogen-fluoride-containing gas.

As shown in FIG. 5(c), after ending the etch of Step 2, the vacuum transferring mechanism 70 takes out the substrate S from the first plasma etching apparatus 30 and transfers the same to the second plasma etching apparatus 40. In the second plasma etching apparatus 40, the plasma etching is implemented to the lower Ti film 5c of the Ti/Al/Ti laminated film 5 by using the hydrogen-fluoride-containing gas, such as $CHF_3$.

In the second plasma etching apparatus 40, first, the inside of the chamber 104 is adjusted by the exhaust mechanism 160 to a pressure matching the vacuum transferring chamber 10. The gate valve G is opened, and the vacuum transferring mechanism 70 carries the substrate S into the chamber 104 via the carry-in/out port 155 and places the substrate S on the substrate mounting table 130. After the vacuum transferring mechanism 70 is withdrawn from the chamber 104, the gate valve G is closed.

In this state, the pressure in the chamber 104 is adjusted to a predetermined degree of vacuum by the automatic pressure control valve (APC) 162, and the hydrogen-fluoride-containing gas, such as $CHF_3$ or $C_2HF_5$ as an etching gas is supplied from the processing gas supply mechanism 220 to the chamber through the spray housing 111 as a processing gas. In addition to the fluoride-containing gas, an inert gas such as Ar may be supplied as the diluent gas.

At this time, the substrate S is adsorbed by the electrostatic chuck 132, and temperature adjustment is performed by a temperature adjustment mechanism (not shown).

Then, a uniform induced electric field is formed in the chamber 104 via the dielectric wall 102 by supplying high frequency power having a frequency of, such as, 13.56 MHz from the high frequency power supply 115 to the high frequency antenna 113. Using such induced electric field, a plasma of a hydrogen-fluoride-containing gas is generated. Thus, the generated high density inductively coupled plasma etches the lower Ti film 5c in the Ti/Al/Ti laminated film 5 of the substrate S.

Then, when the etching end point is detected by a predetermined method, the etching is ended.

Step 4, delivering the substrate after the first plasma etching into a processing container of a second plasma etching apparatus, and implementing a post-treatment step for suppressing corrosion by using plasma containing an oxygen-containing gas and a hydrogen-fluoride-containing gas.

As shown in FIG. 5(d), after the etching of Step 3, in a state where the substrate S is held on the substrate mounting table 130 in the chamber 104 of the second plasma etching apparatus 40, $O_2$ or $O_2$ and fluorine-containing gas (such as $CF_4$) are supplied into the chamber 104 as processing gases to implement post-treatment for suppressing corrosion.

After the etching of Step 3 in the second plasma etching apparatus 40, the inside of the chamber 104 is evacuated by the exhaust mechanism 160. At this time, an inert gas such as an Ar may be supplied from the inert gas supply source 224 as needed to purify the chamber. Then, the pressure in the chamber 104 is adjusted to a predetermined degree of vacuum, and an oxygen-containing gas and a hydrogen-fluoride-containing gas are supplied from the processing gas supply mechanism 220 to the chamber 104 via the spray housing 111 as the post-treatment gases. Besides, an inert gas such as Ar may be supplied as a diluent gas.

Then, an induced electric field is formed in the chamber 104 by supplying high frequency power from the high frequency power supply 115 to the high frequency antenna 113 to generate plasma containing an oxygen-containing gas and a hydrogen-fluoride-containing gas. Such generated inductively coupled plasma is used for post-treatment to suppress corrosion after plasma etching. At this time, as the post-treatment gas, only the $O_2$ possesses the effect of suppressing corrosion. However, when the hydrogen-fluoride-containing gas, such as $CHF_3$ or $C_2HF_5$ is added to $O_2$, the effect of suppressing corrosion can be enhanced. Furthermore, as the hydrogen-fluoride-containing gas used for the post-treatment, $CHF_3$ or $C_2HF_5$ is preferable. The hydrogen-fluoride-containing gas used in etching the lower Ti film 5c and the hydrogen-fluoride-containing gas used in the post-treatment are preferably the same. The hydrogen-fluoride-containing gas in the two processes uses the same gas, which simplifies the gas supply mechanism. Meanwhile, since the post-treatment for suppressing corrosion can be performed while performing etching, the time for post-treatment for suppressing corrosion can be shortened.

After the post-treatment in the second plasma etching apparatus 40, the vacuum transferring mechanism 70 takes out the substrate S from the chamber 104 of the second plasma etching apparatus 40, transfers the same to the vacuum delivering chamber 20, and returns the substrate to the carrier 50 by the transferring mechanism 60.

In the plasma etching of the Ti/Al/Ti laminated film according to the prior art, the three layers are uniformly etched in a chamber of a plasma etching apparatus by using a chlorine-containing gas such as $Cl_2$, and then the post-treatment is implemented in the same chamber by using plasma containing an oxygen-containing gas and a hydrogen-fluoride-containing gas.

At this time, Ti and Al which constitute the Ti/Al/Ti laminated film are etched by the $Cl_2$ gas, and gaseous $TiCl_X$ (for example, $TiCl_4$) and $AlCl_X$ (such as $AlCl_3$) are generated by the following reaction, and are discharged from the chamber.

$Ti + Cl_2 \rightarrow TiCl\uparrow$ $Al + Cl_2 \rightarrow AlCl\uparrow$

However, after supplying the oxygen-containing gas and the hydrogen-fluoride-containing gas at the time of performing the post-treatment for suppressing corrosion, the gases will react with $AlCl_X$ remaining in the chamber to form solid $AlO_X$ or $AlF_X$, which remains in the chamber to form particles and adversely affects the product.

In addition, when the Ti/Al/Ti laminated film is uniformly etched by a chlorine-containing gas, such as $Cl_2$, as overetching, the oxide semiconductor film of the substrate is etched, and an amount of peeling of the oxide semiconductor film is increased.

Therefore, in this embodiment, after the etching process is implemented to the upper Ti film 5a and the Al film 5b of the Ti/Al/Ti laminated film 5 by using a chlorine-containing gas, such as $Cl_2$ in the first plasma etching apparatus 30, the etching is implemented to the lower Ti film 5c of the Ti/Al/Ti laminated film 5 by using the hydrogen-fluoride-containing gas, such as $CF_4$ in the second plasma etching apparatus 40. Then, the second plasma etching apparatus 40 performs the post-treatment by using plasma containing an oxygen-containing gas and a hydrogen-fluoride-containing gas.

Thus, in the first plasma etching apparatus 30, $O_2$ gas and fluorine-containing gas are not used, so that generation of $AlO_X$ and $AlF_X$ in the processing container can be suppressed. Moreover, since in the second plasma etching apparatus 40, there is no chlorine-containing reaction by-product generated by etching in the processing container, all Al adheres only to the substrate, so that $AlO_X$ and $AlF_X$ in the chamber can be reliably suppressed. Therefore, it is possible to significantly reduce the particles generated in the processing container.

Furthermore, in the first plasma etching apparatus 30, only the upper Ti film 5a and the Al film 5b of the Ti/Al/Ti laminated film 5 are etched, and the lower Ti film 5c is preserved. The semiconductor film formed by oxide semiconductor is not directly etched by the chlorine-containing gas. Meanwhile, since the lower Ti film 5c is etched in the second plasma etching apparatus 40 with a fluorine-containing gas, and the oxide semiconductor is resistant to the fluorine-containing gas. Thus, in the second plasma etching apparatus 40, the etching of the semiconductor film 4 formed by oxide semiconductor is also suppressed. Therefore, the amount of peeling of the oxide semiconductor film 4 formed by oxide semiconductor can be increased.

Furthermore, in the second plasma etching apparatus 40, when the post-treatment for suppressing corrosion is performed by using both the $O_2$ gas and the fluorine-containing gas which have a good effect of suppressing corrosion, the fluorine-containing gas for etching the lower Ti film 5c and the fluorine-containing gas for the post-treatment gas are the same. Therefore, the gas supply mechanism of the second plasma etching apparatus 40 can be simplified. Meanwhile, the post-treatment for suppressing corrosion can be performed while performing etching, thus the time for post-treatment for suppressing corrosion can be shortened.

Furthermore, the processing is performed in the two apparatuses, the first plasma etching apparatus 30 and the second plasma etching apparatus 40, so there is a concern that productivity is lowered. However, the plasma etching system 100 is equipped with three first plasma etching apparatuses 30 that perform Step 2 in which the processing time is relatively long, and two second plasma etching apparatuses 40 that perform the Step 3 and Step 4 in which the total processing time is shorter than Step 2, thus a high productivity can be maintained without causing equipment to be too large. Namely, in the present application, three first plasma etching apparatuses 30 that perform Step 2 and two second plasma etching apparatuses 40 that perform the Step 3 and Step 4 are equipped. Therefore, it is possible to keep the equipment to a minimum size but maintain the high productivity as much as the prior art.

In the Ti/Al/Ti laminated film used for the source and the drain of the TFT, since the central Al film is formed thick, the etching of the Ti/Al/Ti laminated film is mainly the etching of the Al film. When the Al film is etched by using the chlorine-containing gas such as $Cl_2$, the etching rate tends to be higher on the outer periphery of the substrate. Namely, in the etching of a highly reactive film, such as the Al film, the etching rate of the peripheral portion of the substrate is higher in the peripheral portion of the substrate with a larger amount of unreacted etching gas due to the loading effect. It is difficult to control the non-uniformity of this etching rate by using the in-plane distribution of plasma power or gas flow.

Therefore, if the in-plane uniformity of the etching rate is poor, a longer overetching is required. When the lower Ti film is not etched as described above, the lower Ti film in the outer peripheral portion of the substrate is also etched to damage the semiconductor film formed by the oxide semiconductor.

Therefore, in this embodiment, a sacrificial material made of Al is provided on the frame-shaped shield ring 133 configured on the outer circumference of the substrate S to surround the outer periphery of the substrate S, so that excess chlorine-containing gas on the periphery of the substrate can be consumed on the sacrificial material, and the loading effect can be suppressed to suppress the etching rate of the outer peripheral portion of the substrate. Thereby, the in-plane etching uniformity can be improved, and the time of overetching can be shortened, and the damage to the semiconductor film formed by oxide semiconductor can be further reduced.

The plasma etching method and system provided by the present application can be applied to various fields. Here, the field of conductive line fabrication will be described.

Figure 6:
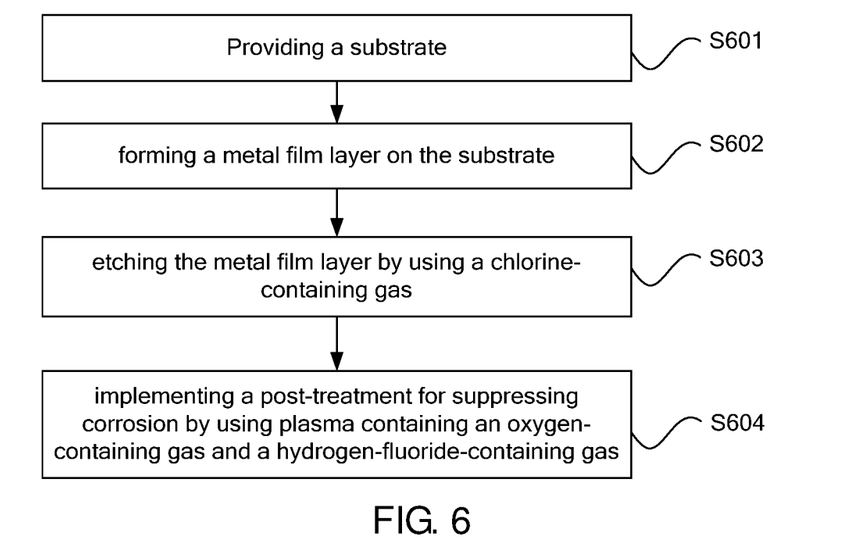
FIG. 6 is a flow chart of a method for fabricating a conductive line provided by the present application.
Figure 7:
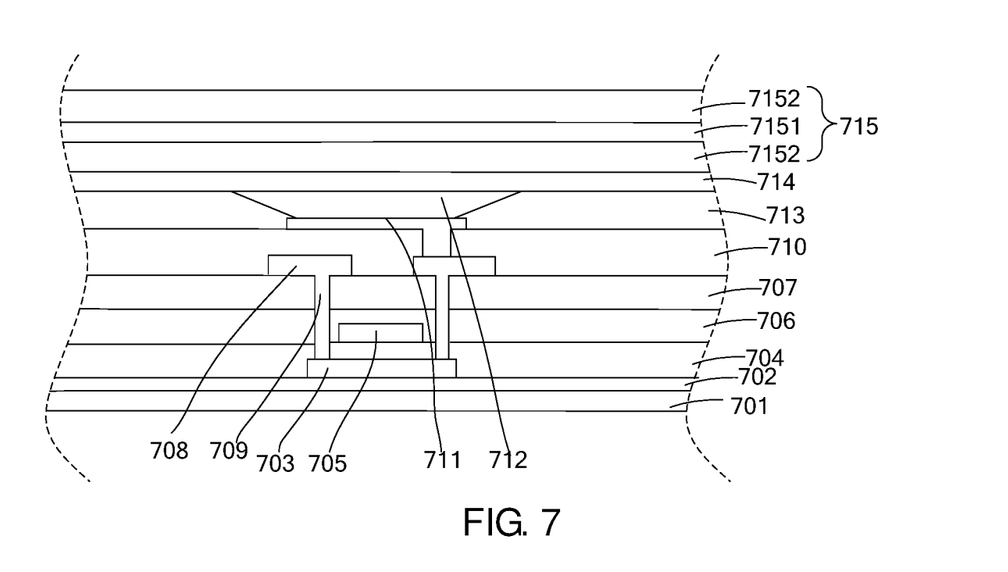
FIG. 7 is a cross-sectional structural diagram of a display panel provided by the present application.

As shown in FIG. 6 and FIG. 7, a method for fabricating a conductive line provided by the present application includes steps of:

Step S601, providing a substrate 71.

In one embodiment, the substrate 71 is an array substrate. For instance, the substrate can be a low temperature polysilicon array substrate or an active matrix organic light emitting diode array substrate. However, the present application is not limited thereto as long as the substrate can serve as a substrate for a conductive line. The substrate 71 may be a polymer substrate or a substrate made of other similar materials, such as a polyimide substrate.

Step S602, forming a metal film layer 72 on the substrate 71.

In one embodiment, the metal film layer 72 includes an aluminum film layer. In one embodiment, the metal film layer 72 is a titanium/aluminum/titanium (Ti/Al/Ti) film layer. Namely, as shown in FIG. 7, the metal film layer 72 includes a titanium sub-layer 721, an aluminum sub-layer 722 and a titanium sub-layer 723. The aluminum sub-layer 722 is interposed between the titanium sub-layers 721 and 723. Alternatively, the metal film layer 72 is composed of only one aluminum film layer.

Step S603, etching the metal film layer 72 by using a chlorine-containing gas.

In one embodiment, a portion of the metal film layer 72 is etched by using chlorine gas to pattern the metal film layer 72 to form a conductive line.

Step S604, implementing a post-treatment for suppressing corrosion by using plasma containing an oxygen-containing gas and a hydrogen-fluoride-containing gas.

In the etching chamber, a mixed gas of oxygen and $CHF_3$ or a mixed gas of oxygen and $C_2HF_5$ is injected into the chamber; then, the plasma is obtained with decomposition and dissociation to further react with the patterned metal film layer 72 to prevent the patterned metal film layer 72 from being corroded.

The principle involved in this step is:

$AlCl_3$ is molecular crystal and is easily soluble in water (45.8 g/100 mL). $AlF_3$ is an ionic crystal and hardly soluble in water; the occurrence of this reaction can effectively prevent the occurrence of the Al corrosion.

Although $CF_4$ can be used to obtain F*, for the compound $CF_4$, C—F is a covalent bond, and the bonding force between C and F is particularly strong; if C—F covalent bond is to be interrupted, it is required to provide high energy. Therefore, the etching chamber requires a very high source power (about 15,000 watts) to decompose and dissociate $CF_4$, which needs higher power, that is, more power. Meanwhile, in order to ensure that sufficient F* can be produced, the etching chamber must be supplied with $CF_4$ with a higher flow rate, which undoubtedly increases the manufacturing cost.

Therefore, in this embodiment $C_XH_YF_Z$ and $O_2$ are used as particle sources of F*, H* and O* to provide F* for the chemical reaction F—+F*+$AlCl_3$→$AlF_3$+Cl—+Cl*; meanwhile, a sufficient amount of H* and O* can be provided to combine Cl— and Cl*, so that the chemical reaction F—+F*+$AlCl_3$→$AlF_3$+Cl—+Cl* continues in the positive direction and will completely replace Cl* adhered to the surface of the metal film layer to improve the replacement efficiency, which well achieves the technical effect of completely avoiding corrosion of aluminum.

Meanwhile, the bonding force of the C—F bond in the gas series, such as $CHF_3$ and $C_2HF_5$ is much lower than the bonding force of C—F in $CF_4$, and the chemical bond of $O_2$ is also particularly easy to break. Therefore, the energy required to dissociate $C_XH_Z$ ($F_Z$ ($CHF_3$, $C_2HF_5$, etc.) and $O_2$ is very low, that is, the source power required to dissociate and decompose these gases is very low, from 6,000 watts to 10,000 watts.

Furthermore, the prices of $C_XH_Z$ ($F_Z$ ($CHF_3$, $C_2HF_5$, etc.) and $O_2$ are very low, and the usage of these two gases can significantly reduce the manufacturing cost of the conductive line.

Figure 8:
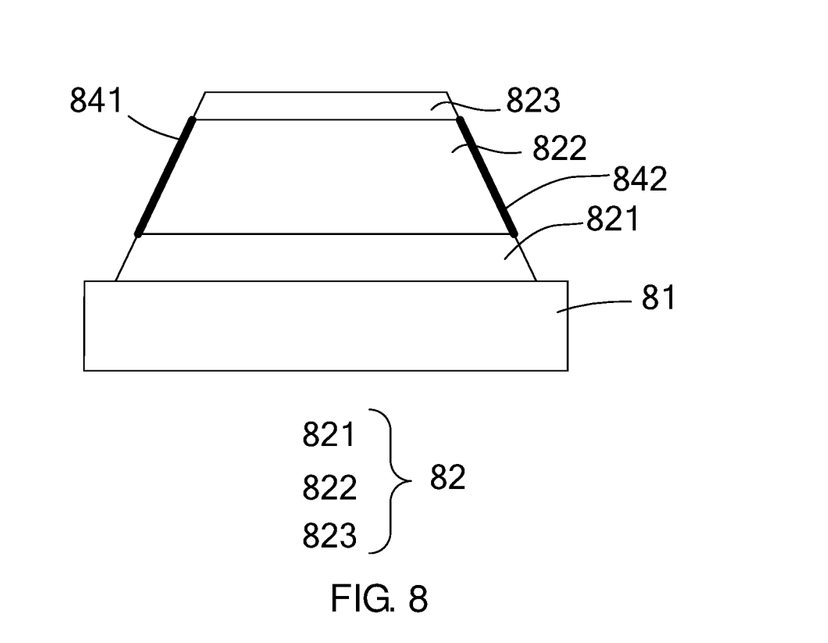
FIG. 8 is a cross-sectional structural diagram of a conductive line provided by the present application.

As shown in FIG. 8, after the post-treatment step, the patterned metal film layer 82 possesses a smooth, non-concave etched surface, i.e. the sidewalls 841 and the sidewalls 842.

With the plasma etching method and system provided by the foregoing embodiments, the present application can be employed to manufacture various panels, and a display panel will now be described as an illustration.

FIG. 7 is a film layer structure diagram of a display panel provided by the embodiment of the present application. As shown in FIG. 7, the display panel includes:

a substrate 701, wherein a raw material of the substrate 701 may be one of a glass substrate, a quartz substrate and a resin substrate;

a buffer layer 703 formed on the substrate 701, and mainly used for buffering the pressure between the lamellar structure of the films, and provided with a function of blocking water and oxygen;

an active layer 703 formed on the buffer layer, wherein the active layer 703 includes an ion-doped doping region;

a first insulating layer 704, formed on the active layer 703; wherein in one embodiment, the first insulating layer 704 is an inter-insulating layer, and the inter-insulating layer covers the active layer 703, and the inter-insulating layer is used to insulate the active layer 703 from other metal layers;

a gate layer 705, formed on the first insulating layer 704, wherein a metal material of the gate 705 may be a metal such as molybdenum, aluminum, aluminum-nickel alloy, molybdenum-tungsten alloy, chromium, copper or a combination of the aforesaid metal materials; in one embodiment, the metal material is molybdenum;

a second insulating layer 706 formed on the gate layer 705; wherein in this embodiment, the second insulating layer is a first gate insulating layer, and the second insulating layer covers the active layer 103; in one embodiment, the second insulating layer 106 possesses a thickness of 50 nm to 200 nm, and a material of the first gate insulating layer is usually silicon nitride, silicon oxide or silicon oxynitride;

a third insulating layer 707 formed on the second insulating layer 706; wherein in this embodiment, the third insulating layer 707 is a second gate insulating layer, and the second gate insulating layer is mainly used to insulate the gate layer 705 from the source and drain layers 708; in one embodiment, the second insulating layer 106 possesses a thickness of 50 nm to 200 nm;

a source drain layer 708 formed on the third insulating layer 708; wherein a metal material of the source drain layer 708 may be a metal such as molybdenum, aluminum, aluminum-nickel alloy, molybdenum-tungsten alloy, chromium, copper, titanium aluminum alloy or a combination of several aforesaid metal materials; in one embodiment, the metal material of the source drain layer 708 is titanium aluminum alloy; the source drain layer 708 is connected to the doping region through a via hole 709;

a planarization layer 710 formed on the source drain layer 708; wherein the planarization layer is used to ensure the flatness of the thin film transistor process;

an anode layer 711 formed on the planarization layer 710; wherein the anode layer 711 includes at least two anodes arranged in an array, and the anode layer is mainly used to provide holes for absorbing electrons; in one embodiment, an organic light emitting device is a top emission type organic light emitting device, and the organic light emitting device is a white light organic light emitting device that emits white light, and therefore, the anode layer is a non-transparent light blocking layer;

an organic light emitting layer 712 formed on the anode layer 711; wherein the adjacent organic light emitting layers 712 are separated by a pixel defining layer 713; wherein in this embodiment, the organic light emitting layer 712 includes a first common layer, a light emitting layer and a second common layer; the first common layer is used for injection and transport of the holes, and the first common layer includes a hole injection layer and a hole transport layer, and therefore, the first common layer may be referred to as a hole transport functional layer; the second common layer is formed on the first common layer, and the first common layer is used for injection and transport of the electrons, and the second common layer includes an electron injection layer and an electron transport layer, and therefore, the second common layer may be referred to as an electron transport functional layer; the light emitting layer is located between the first common layer and the second common layer, and the light emitting layer is an organic semiconductor having a special energy band structure, and after absorbing electrons migrated from the anode, a photon of a certain wavelength is emitted, and the photons entering our eyes are the colors we see;

a cathode layer 714 formed on the organic light emitting layer 712, wherein the cathode layer 714 is used to provide the electrons; in this embodiment, the cathode layer 714 is made of a transparent material, and the light generated by the light emitting layer is projected outward through the cathode layer 714;

a thin film encapsulation layer 715 formed on the cathode layer 714; wherein the thin film encapsulation layer 715 mainly functions as a water and oxygen barrier to prevent external water vapor from eroding the organic light emitting layer, and the thin film encapsulation layer 715 includes at least one organic layer and at least one inorganic layer which are alternately stacked; an organic encapsulation layer is generally located in the middle of the thin film encapsulation layer 715, and inorganic encapsulation layers are located on both sides of the thin film encapsulation layer 715, and the organic encapsulation layer is wrapped in the middle; in this embodiment, the thin film encapsulation layer includes an organic layer 7151 and two inorganic layers 7152, which are alternately arranged.

Although the organic encapsulating layer is very flexible, the barrier property against water and oxygen is very limited, and the dense pinhole-free inorganic encapsulating layer possesses higher capability of blocking the water oxygen, but it is difficult to prepare a dense high-quality film layer as reaching a certain thickness, and the film performance is rigid and easy to break; therefore, most of the flexible packaging materials in the world are based on the packaging structure of alternating composite structures of organic or inorganic multilayer films.

Based on the above description, as shown in FIG. 8, in the present application, the display panel 8 includes a substrate 81 and a metal film layer 82, wherein the metal film layer 82 is formed on the substrate 81; wherein the metal film layer includes at least one aluminum layer; the metal film layer 82 may be the source drain layer 708 in FIG. 7, or may be an SD trace not shown in FIG. 7. Based on the aforesaid plasma etching method, in the present application, an etched surface of the at least one aluminum layer formed by plasma etching is covered with an aluminum ion-containing crystal.

In one embodiment, a titanium-aluminum-titanium layer is illustrated as the metal film layer 82. As shown in FIG. 8, the display panel 8 includes:

a substrate 81;

a metal film layer 82 (including a titanium sub-layer 821, a aluminum sub-layer 822 and a titanium sub-layer 823), wherein the metal film layer 82 is formed on the substrate 81;

wherein an etched surface of the at least one aluminum layer formed by plasma etch, i.e. the side wall 841 and the side wall 842, is covered with an aluminum ion-containing crystal. Because aluminum ion-containing crystal is ionic crystal that does not chemically react with moisture and oxygen in the air, and thus does not corrode the Al (aluminum) layer to solve the technical problem of corrosion of the Al layer in the plasma etching technology of the prior art.

In one embodiment, as shown in FIG. 8, the etched surface of the at least one aluminum layer, the side wall 841 and the side wall 842 is a flat plane.

In one embodiment, the aluminum ion-containing crystal is aluminum fluoride.

In one embodiment, the metal film layer is a titanium aluminum titanium layer.

In one embodiment, the titanium aluminum titanium layer is patterned to form a source line and a drain line.

In one embodiment, the titanium aluminum titanium layer is patterned to form a signal line.

Please refer to FIG. 9. If the metal film layer 82 is not subjected to the foregoing post-treatment step, the Cl* on the surface of the aluminum sub-film layer 822 cannot be completely replaced. Then, the etched surface of the aluminum sub-layer 822 is covered with crystals containing aluminum molecules, which will chemically react with moisture and oxygen in the air. The surface of the film layer may be uneven due to corrosion, and the etched surface of the metal film layer 82, i.e. the side wall 841 and the side wall 842 may be concave.

It can be known according to the aforesaid embodiment:

the present application provides a new display panel, a new plasma etching method and a new system. After patterning the metal film layer on the substrate with the chlorine-containing gas to implement the patterning process of forming the conductive line, the substrate after the first plasma etching is delivered into the processing container of the second plasma etching apparatus under vacuum condition and then, the post-treatment for suppressing corrosion is implemented by using plasma containing the oxygen-containing gas and the hydrogen-fluoride-containing gas; thus, $AlCl_X$ on the surface of the metal film layer is replaced with $AlF_X$, and because $AlF_X$ is ionic crystal that does not chemically react with moisture and oxygen in the air, and thus does not corrode the Al (aluminum) layer, which solves the technical problem of corrosion of the Al layer in the plasma etching technology of the prior art.

In summary, although the above preferred embodiments of the present application are disclosed, the foregoing preferred embodiments are not intended to limit the invention, those skilled in the art can make various kinds of alterations and modifications without departing from the spirit and scope of the present application. Thus, the scope of protection of the present application is defined by the scope of the claims.

What is claimed is:

1. A display panel, including:
   a substrate;
   a metal film layer formed on the substrate; wherein the metal film layer includes at least one aluminum layer;
   wherein an etched surface of the at least one aluminum layer formed by plasma etching is covered with an aluminum ion-containing crystal.

2. The display panel according to claim 1, wherein the etched surface of the at least one aluminum layer is a flat plane.

3. The display panel according to claim 1, wherein the aluminum ion-containing crystal is aluminum fluoride.

4. The display panel according to claim 1, wherein the metal film layer is a titanium aluminum titanium layer.

5. The display panel according to claim 4, wherein the titanium aluminum titanium layer is patterned to form a source line and a drain line.

6. The display panel according to claim 5, wherein the titanium aluminum titanium layer is patterned to form a signal line.

7. The display panel according to claim 1, wherein the display panel includes:
   a buffer layer formed on the substrate;
   an active layer formed on the buffer layer, wherein the active layer includes an ion-doped doping region;
   a first insulating layer formed on the active layer;
   a gate layer formed on the first insulating layer;
   a second insulating layer formed on the gate layer;
   a third insulating layer formed on the second insulating layer;
   a source drain layer formed on the third insulating layer and connected to the doping region through a via hole;
   a planarization layer formed on the source drain layer;
   an anode layer formed on the planarization layer;
   an organic light emitting layer formed on the anode layer;
   a cathode layer formed on the organic light emitting layer; and
   a thin film encapsulation layer formed on the cathode layer;
   wherein the metal film layer includes the source drain layer.

8. The display panel according to claim 7, wherein the substrate includes one of a glass substrate, a quartz substrate and a resin substrate.

9. The display panel according to claim 7, wherein the first insulating layer covers the active layer.

10. The display panel according to claim 7, wherein a material of the gate layer includes at least one of molybdenum, aluminum, aluminum-nickel alloy, molybdenum-tungsten alloy, chromium and copper.

11. The display panel according to claim 7, wherein the anode layer is a non-transparent light blocking layer.

12. The display panel according to claim 7, wherein the organic light emitting layer includes a first common layer, a light emitting layer and a second common layer.

13. The display panel according to claim 7, wherein the cathode layer is made of a transparent material.

14. The display panel according to claim 7, wherein the thin film encapsulation layer includes an organic layer and two inorganic layers, which are alternately arranged.

* * * * *